POWER AMPLIFIERS WITH COMPLEMENTARY PAIR DRIVER STAGES

Filed April 1, 1969 3 Sheets-Sheet 1

United States Patent Office 3,562,658
Patented Feb. 9, 1971

3,562,658
POWER AMPLIFIERS WITH COMPLEMENTARY PAIR DRIVER STAGES

John Dunn Collinson, Otley, Yorkshire, England, assignor to The Rank Organisation Limited, London, England, a British company Filed Apr. 1, 1969, Ser. No. 811,919
Claims priority, application Great Britain, Mar. 29, 1968, 15,112/68
Int. Cl. H03f 3/18
U.S. Cl. 330—17 9 Claims

ABSTRACT OF THE DISCLOSURE

A transistor amplifier of which the output stage has two transistors driven by Darlington coupled driver transistors which receive their inputs from a current limiting stage and including a second stage supplying the input of the first stage and having an output impedance which is less than the first stage input impedance.

This invention relates to transistor power amplifier circuits and particularly to output-transformerless audio power amplifier circuits including a pair of output transistors each with a driver stage.

In a conventional output-transformerless power amplifier two output transistors of like polarity are connected in series with the D.C. supply. In order to simplify the D.C. connection of the driver stages and to obtain phase reversal complementary driver transistors are used, also connected in series with the D.C. supply. The bases of the driver transistors can have the same (or nearly the same) D.C. potential of Vcc/2 and can, therefore, be driven from a single transistor. With the simplest arrangement the whole of the A.C. output appears in series with the driver input, the driver/output stage has full negative feedback, and the overall gain approaches unity. It is more effective to spread the negative feedback over earlier stages as well so that it is usual to bootstrap the output to the driver input and, therefore, remove all negative feedback from the driver/output stages.

The object of the invention is to produce economically an improved amplifier of the above type with a measure of self protection against external faults, with low distortion, and with high efficiency.

According to the invention there is provided a transistor power amplifier circuit comprising an output stage having two power output transistors of the same or opposite polarity for connection in series with a D.C. supply, and connected directly together, the junction of the output transistors being for connection to an output terminal, a complementary transistor pair driver stage, each transistor of said driver stage pair being effectively connected in a Darlington circuit with a different one of said output transistors, a single transistor first stage preceding said driver stage of which the output of the first stage transistor is connected to the inputs of said driver stage, which is a current gain stage, and which is designed to limit the current drawn by said first stage to such a value that the maximum current drawn by the ensuing stages is insufficient to damage the transistors of said stages, and a second stage having a transistor therein and preceding said first stage, the mutual conductance of the transistor of said second stage being determined by a resistance in its emitter circuit, said resistance not being by-passed by a capacitor, the input impedance of said first stage being lower than the output impedance of the second stage.

Thus, an amplifier according to the invention is protected against external faults by limiting the output current by means of the current-limiting circuit means, but the amplifier does not suffer from the disadvantages of variation in the mutual conductance of the first stage because the latter is arranged as a current amplifier.

The invention also permits the elimination of emitter resistors in the output stage thus affording a reduction in power loss and a simple temperature compensation, by making the current gain largely independent of collector current, whereby the output stage quiescent current may be small and not critical.

The invention will now be described in more detail with reference to the accompanying drawings in which.

Figure 1:
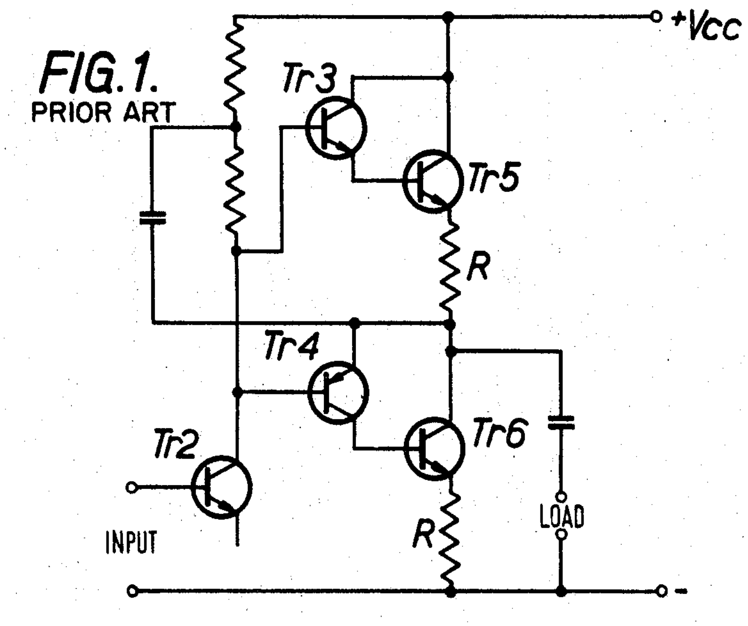
FIG. 1. PRIOR ART
FIG. 1 shows the basic circuit of a known output transformerless power amplifier circuit.

It is convenient, first to consider the known circuit as shown in FIG. 1.

CALCULATION OF VOLTAGE GAIN

In the arrangement of FIG. 1 each driver transistor Tr3/Tr4 is effectively connected in a Darlington circuit with its output transistor Tr5/Tr6. In the absence of Tr5 emitter resistor R and assuming Tr3 and Tr4 base source resistance is high there is no output stage current feedback. The pairs Tr3/5 and Tr4/6 act as current amplifiers into the load on alternate half-cycles. If a peak output current of $I_L$ is required the peak base current of Tr3 will be $$\frac{I_L}{hfe_3 \cdot hfe_5}$$

Given a peak output current 4 a., (minimum) $hfe_3$ of 50 and $hfe_5$ of 20, the driver peak base current will be 4 ma.

If this is the maximum current required, $Tr_2$ Ic can be made 4 ma. and the output stage will be protected against excessive current.

For a collector current of 4 ma., the *gm* of Tr2 will be about 125 ma./v. or $re_2 = 8\Omega$. The overall gain from Tr2 base into the load will be $$\frac{hfe_3 \cdot hfe_5 \cdot R_L}{re_2}$$

with $R_L = 8\Omega$ and the typical values given above the voltage gain=1000 or 60 db.

DISTORTION

For 50 watts into 8Ω, the output voltage $Vo = 20$ v. If the sensitivity required is say 0.5 v. the voltage gain required will be 40 or 32 db, leaving 28 db for negative feedback. In an amplifier of this type, i.e. basically current driven, the distortion will arise from variations of *hfe*. The output transistor current gain falls off with increasing Ic, and (if the output transistors are similar) this will produce odd order harmonics. If the current gain of Tr3/5 does not equal Tr4/6, amplification of alternate half cycles will not be equal and even order harmonics will be produced.

As Tr2 is working nearly to current clipping (necessary to limit output current) its *gm* will vary considerably and it will be a source of even order harmonic distortion.

If the distortions should total say 10% then 28 db of feedback will only reduce this to 0.4%. This is too near a target of say 0.5%. A method of improving this could be to closely match the current gains in each half, and possibly to add some form of linearizing to the Tr2 stage.

DISTINCTION BETWEEN VOLTAGE AND CURRENT AMPLIFICATION

A simple common emitter transistor amplifier has a high output resistance. This may be reduced by using a low collector load or by the use of negative feedback derived from the voltage output.

The input resistance is low as current and voltage is required to produce an output. This may be increased by deriving feedback from the current through the load (normally by an emitter resistor). This effectively raises the input voltage required at the same current, therefore the input resistance is increased.

The input resistance of a voltage amplifier stage is high compared with its source resistance. Conversely the input resistance of a current amplifier stage is low compared with its source resistance. The change between voltage and current operation can be said to occur at the point where input resistance equals source resistance.

IMPORTANCE OF SOURCE RESISTANCE IN EMITTER FEEDBACK STAGE

It should be noted that the amount of negative feedback over a stage with an unbypassed emitter resistor depends on the source resistance from which it is fed. If the source resistance (R*s*) is high compared with the input resistance (R*in*) the gain will be the same as if the source impedance is low. However, if the source is high the input signal is attenuated by the ratio:

$$\frac{Rin}{Rs+Rin}$$

If R*s* is low the signal is little attenuated, but the overall gain remains the same because the feedback controls it. As the attenuation decreases the internal gain increases and, therefore, there is more feedback.

If the feedback is required for some definite function, e.g. to reduce distortion or improve thermal stability, it is necessary to check that R*s* is low compared with R*in* otherwise the feedback may be ineffective.

EFFECT OF OUTPUT STAGE EMITTER RESISTOR

The frequency cut-off of a transistor output stage can be extended by a factor of three or four by operating it as a voltage amplifier as the low source resistance reduces the effect of the high effective input capacitance. With a low driver source and an output stage emitter resistor, local feedback is applied over the output stage as the output stage gain is now controlled by R. However, at low levels R no longer swamps *re* and cross-over distortion appears unless the quiescent current is very carefully controlled. If the quiescent current is such that $$re\left(=\frac{25\times10^{-3}}{Ic}\right)$$

is less than R, and the source impedance is less than *hfe* (*R*+*re*), the emitter resistor helps to stabilize the quiescent current.

In the circuit of FIG. 1 the emitter resistor R is effective only in T*r*5 emitter (assuming T*r*3 source is low) as the source resistance of T*r*6 is *rc* (very high) of T*r*4. If the D.C. voltage at the junction of T*r*5 emitter and T*r*6 collector is stabilized by overall D.C. feedback to *Vcc*/2, then T*r*5 emitter resistor will stabilize T*r*6 also. If T*r*6 I*q* drifts the overall D.C. feedback will return it to the I*q* of T*r*5 in order to keep the mid-point to *Vcc*/2.

As the output current flows through T*r*5 emitter resistor into the load it is customary to include a similar resistor in the T*r*6 output circuit in order to equalize the load on each half-cycle.

The question therefore is whether the output stage emitter resistor is necessary.

As the *hfe* of a suitable transistor does not begin to fall off until above 20 kHz. a low impedance drive is not necessary in an audio frequency amplifier. If the stage is current driven, i.e. high source resistance no emitter resistor, the quiescent current can be very small (sufficient to ensure there is some *hfe* at the crossover). If the quiescent current is very small there is no thermal runaway problem. Distortion at high currents will increase, but this is offset by the increased gain which can be used as feedback overall, and the reduced crossover distortion.

Figure 2:
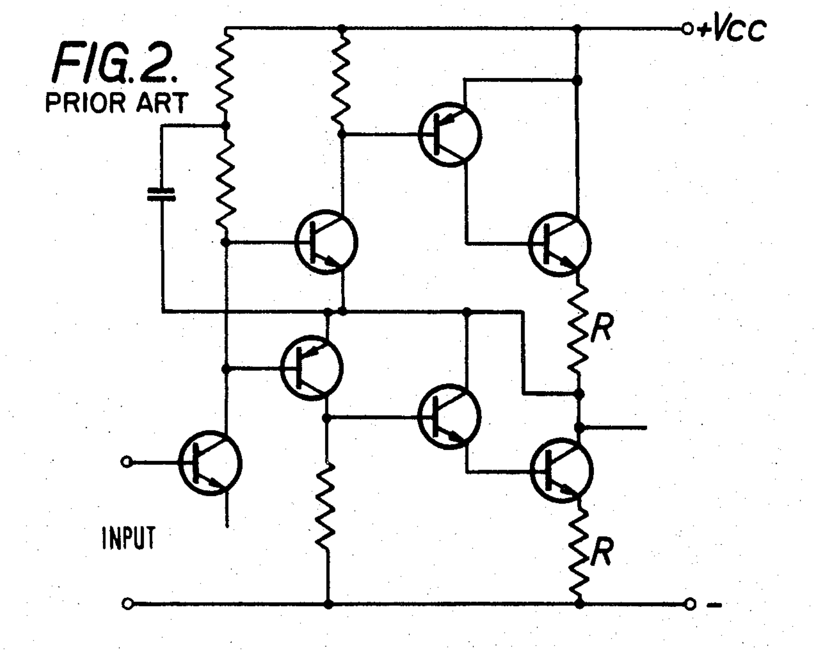
FIG. 2. PRIOR ART
FIG. 2 shows the basic circuit of FIG. 1, rearranged with a push-pull pre-driver stage in a known manner.

In the amplifier circuit shown in FIG. 2 all the transistors have to withstand the full output swing (i.e. V*ce*=V*cc*). It should be more economical to concentrate the gain in the low level stages especially as a single transistor is adequate in place of a pair.

As an alternative to closely matching the current gains in each half of the output stages of the known circuit shown in FIG. 1 and the possible addition of some form of linearizing to the T*r*2 stage, as already stated under "Distortion," the circuit of each embodiment in accordance with the invention, introduces within the main feedback loop and ahead of T*r*2, an additional stage T*r*1.

EFFECT OF ADDITIONAL STAGE

The additional stage T*r*1 will produce an amplifier of greatly improved characteristics as not only will the basic gain be substantially increased but, if T*r*2 is operated as a current amplifier (depending on *hfe* instead of *gm*), the initial distortion will be lower. The T*r*1 stage *gm* distortion can be low as the standing current can be large compared with the peak current demand, T*r*2 still being the current limiting stage.

The embodiment of the invention shown in FIG. 3 will now be described.

A +75 v. supply is used with a —12 v. supply in order to simplify the bias network and also to allow a bigger negative driver swing.

Assuming the amplifier is aimed at giving a total distortion of less than 0.1% say 0.07%, and the initial distortion is 10%, 43 db of negative feedback will be required. A voltage gain of 32 db is required with feedback so that the basic voltage gain without feedback must be 75 db (or 5,500). Given that T*r*2 *hfe*=100, T*r*3 *hfe*=50, T*r*5 *hfe*=20, $R_L$=8 and the $$\text{basic gain}=\frac{hfe_2\cdot hfe_3\cdot hfe_5\cdot R_L}{Re_1+re_1}$$

$Re_1+re_1$ will be 145Ω.

If T*r*1I*c* is 500 μa. its *re* is about 50, therefore, R6 should be 100. As the gain with feedback is 40, R5 should be 3.9K. (This will give a quiescent current of 10 ma. in T*r*5, this may be balanced by connecting a further 3.9K resistor R2 between +75 v. and T*r*5 emitter).

For T*r*1I*c* of 500 μa. and T*r*1V*c* of −6 v. R4 will be 12K. As T*r*1*e* is effectively at earth potential the voltage across $$R_3=\frac{Vcc}{2}=37.5\text{ V.}$$

The emitter current of 500 μa. flows through this so *R*3=75 K. For convenience 68K is used.

The peak output current of 4 a. is $$\frac{4}{hfe_3\cdot hfe_5}=4\text{ ma.}$$

at T*r*3 base. T*r*2 standing current should be 4 ma. and as Ic2R7 should be about 5.5 v. to agree with T*r*1 collector, *R*7=1.5K, *R*8+*R*9=37.5/4 ma.=9.4K so that *R*8+*R*9=4.7K could be suitable.

These component values are given by way of example and one component will have to be variable to set the D.C. operating point. *MRI*+*R*10 provide small forward bias for the small T*r*5/6 I*q* required.

Certain additional components will be needed to ensure stability with various loads, e.g. a CR network across the output to limit high frequency gain with no load.

Figure 3:
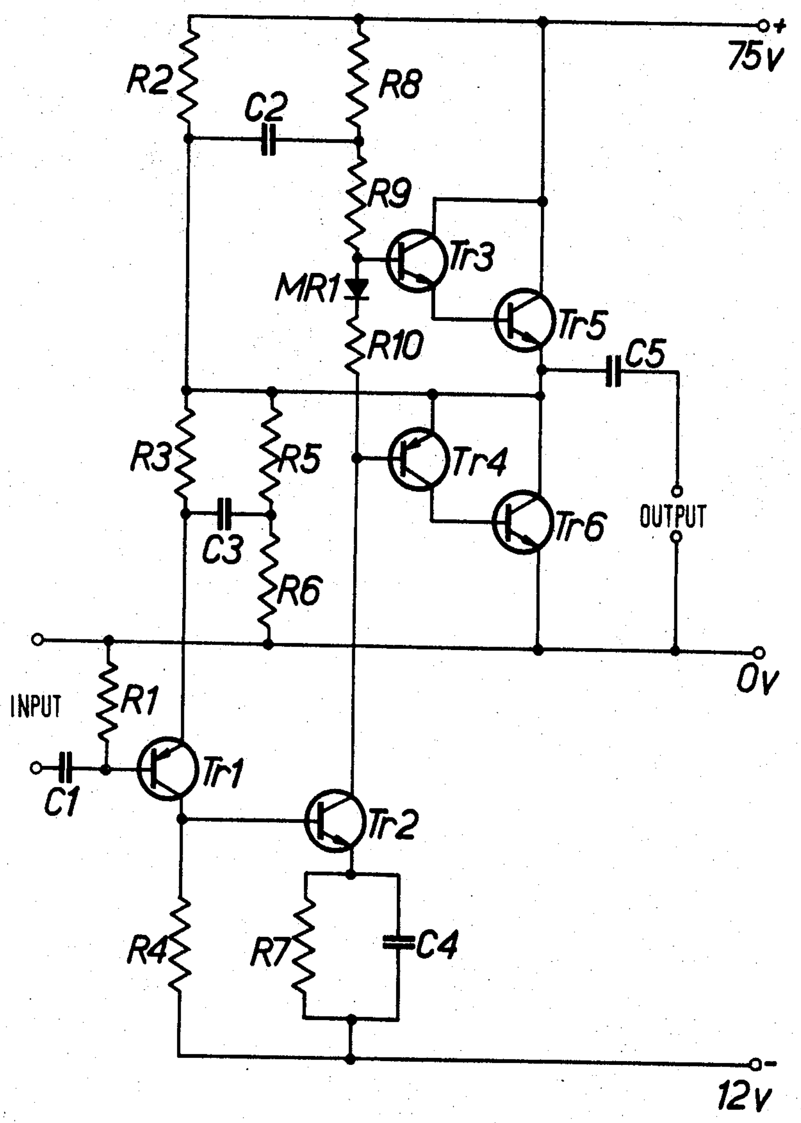
FIG. 3 shows an amplifier circuit in accordance with one embodiment of the invention.
Figure 4:
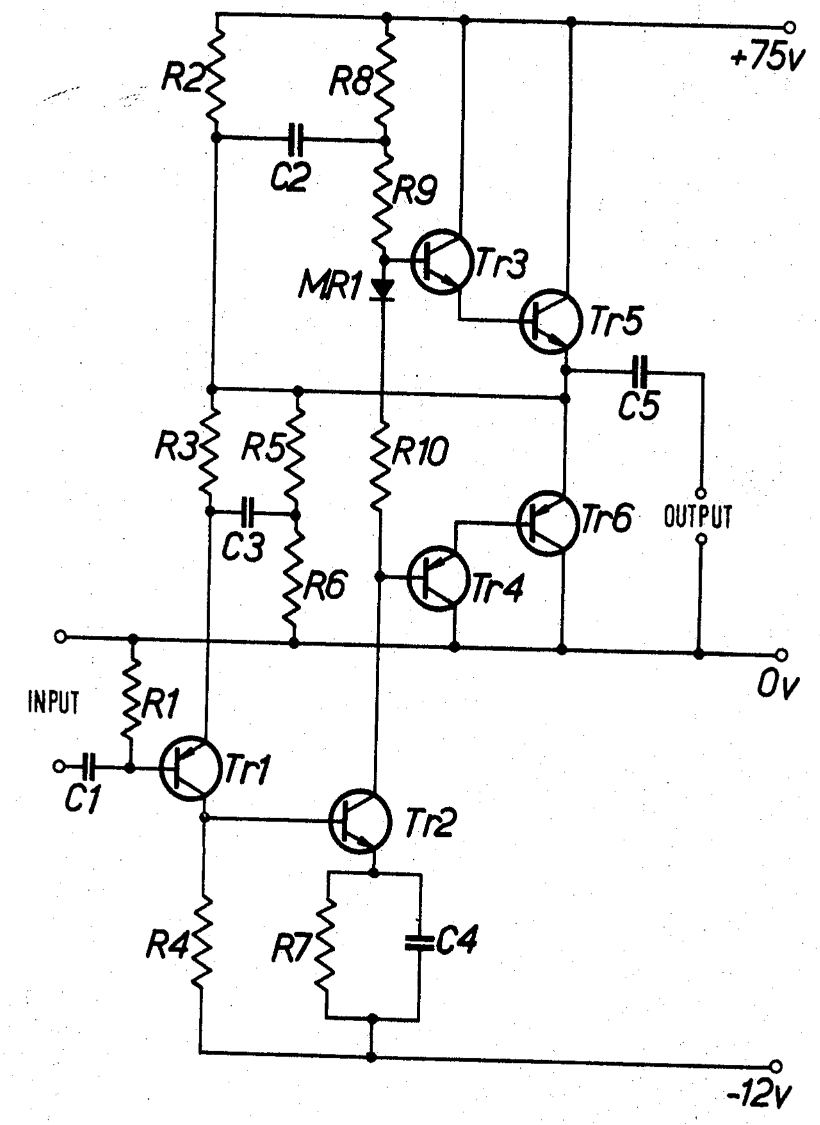
FIG. 4 shows an amplifier circuit in accordance with another embodiment of the invention.

The embodiment of FIG. 4 is identical with the embodiment described in relation to FIG. 3 except that T*r*5 and Tr6 are of opposite polarity with the driver transistors Tr3 and Tr4 appropriately connected as shown.

The invention is not limited to transistors of the type shown, and transistors of opposite conductivity type may be used, with suitable alteration of the polarity of the biassing courses.

I claim:

1. A transistor power amplifier circuit comprising:

(a) an output stage having two power output transistors connected directly together in series and for connection to a D.C. supply;

(b) a complementary transistor pair driver stage of which each driver transistor is effectively connected in a Darlington circuit with a different one of output transistors;

(c) a single transistor, current limited, current-gain stage having its output connected to the inputs of said driver stage and which limits the maximum current drawn by said driver and output stages; and (d) a further stage having its output connected to the input of said current-gain stage and including a transistor having connected in its emitter circuit a resistor that is not by-passed by a capacitor and which determines the mutual conductance of said transistor, the output impedance of said further stage being higher than the input impedance of said current-gain stage.

2. A circuit according to claim 1, wherein the two power transistors of the output stage are similar and of the same polarity.

3. A circuit according to claim 1, wherein the two power output transistors are of opposite polarity.

4. A circuit according to claim 2, including a feedback loop from the output stage, said further stage being included in said feedback loop.

5. A circuit according to claim 3, including a feedback loop from the output stage, said further stage being included in said feedback.

6. A circuit according to claim 2, wherein the collector of the transistor of the current-gain stage is connected to the inputs of the driver stage, and the emitter circuit includes a parallel RC circuit.

7. A circuit according to claim 3, wherein the collector of the transistor of the current-gain stage is connected to the inputs of the driver stage, and the emitter circuit includes a parallel RC circuit.

8. A circuit according to claim 2, including a feedback loop from the output stage, said further stage being included in said feedback loop and wherein the collector of the transistor of the first stage, is connected to the inputs of the driver stage, and the emitter circuit includes a parallel RC circuit.

9. A circuit according to claim 3, including a feedback loop from the output stage, said further stage being included in said feedback loop and wherein the collector of the transistor of the current-gain stage is connected to the inputs of the driver stage, and the emitter circuit includes a parallel RC circuit.

References Cited

UNITED STATES PATENTS

| | | | |
|---|---|---|---|
| 2,896,029 | 7/1959 | Lin | 330—13 |
| 3,281,535 | 10/1966 | Reiffin | 330—17X |

OTHER REFERENCES

Herscher: "Designing Transistor A-F Power Amplifiers," Electronics, Apr. 11, 1958, pp. 96–99.

Sondermeyer: "Inexpensive Audio Power Amplifiers Can Be Reliable," The Electronic Engineer, pp. 35–39, December 1967.

ROY LAKE, Primary Examiner

L. J. DAHL, Assistant Examiner

U.S. Cl. X.R.

330—13